(12) United States Patent
Strmiska et al.

(10) Patent No.: US 8,264,830 B2
(45) Date of Patent: Sep. 11, 2012

(54) EXPANSION CARD RETENTION APPARATUS, SYSTEMS AND METHODS

(75) Inventors: Bernard D. Strmiska, Round Rock, TX (US); James F. McKinney, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 490 days.

(21) Appl. No.: 12/325,264

(22) Filed: Nov. 30, 2008

(65) Prior Publication Data

US 2010/0134989 A1 Jun. 3, 2010

(51) Int. Cl.
*G06F 1/16* (2006.01)
*H05K 1/14* (2006.01)
*H05K 5/00* (2006.01)
*H05K 7/14* (2006.01)

(52) U.S. Cl. ............. 361/679.32; 361/679.31; 361/737; 361/740; 361/741; 361/756; 361/801; 361/802

(58) Field of Classification Search .................... 361/679.31–679.32, 759, 752–753, 737, 361/756, 726, 732, 740, 747, 727, 741, 801–802, 361/686

See application file for complete search history.

(56) References Cited

U.S. PATENT DOCUMENTS

| | | | |
|---|---|---|---|
| 3,878,438 A * | 4/1975 | Weisman | 361/802 |
| 5,575,546 A | 11/1996 | Radloff | |
| 5,831,821 A * | 11/1998 | Scholder et al. | 361/679.32 |
| 5,930,496 A | 7/1999 | MacLaren et al. | |
| 6,166,917 A * | 12/2000 | Anderson | 361/756 |
| 6,173,843 B1 | 1/2001 | Christensen et al. | |
| 6,181,565 B1 | 1/2001 | Schmitt et al. | |
| 6,215,668 B1 | 4/2001 | Hass et al. | |
| 6,278,614 B1 | 8/2001 | Beaman et al. | |
| 6,396,690 B1 * | 5/2002 | Blatti | 361/690 |
| 6,404,624 B1 | 6/2002 | Jeong | |
| 6,425,778 B1 | 7/2002 | Haq et al. | |
| 6,728,114 B2 * | 4/2004 | Serjack et al. | 361/802 |
| 6,771,510 B1 | 8/2004 | Novak et al. | |
| 6,927,984 B2 | 8/2005 | Chen | |
| 7,001,002 B2 * | 2/2006 | Wei | 312/223.2 |
| 7,099,160 B1 * | 8/2006 | Ice | 361/802 |
| 7,113,407 B2 | 9/2006 | Holt et al. | |
| 7,161,798 B2 | 1/2007 | Chen et al. | |
| 7,209,365 B2 | 4/2007 | Chang | |
| 7,301,777 B2 | 11/2007 | Fan et al. | |
| 7,920,387 B2 * | 4/2011 | Barrett et al. | 361/756 |
| 2003/0202334 A1 * | 10/2003 | Vier et al. | 361/810 |

* cited by examiner

*Primary Examiner* — Jayprakash N Gandhi
*Assistant Examiner* — Nidhi Desai
(74) *Attorney, Agent, or Firm* — Baker Botts L.L.P.

(57) ABSTRACT

An apparatus for retaining an expansion card within an information handling system provides a first bracket including a first elongated body defining a first groove for receiving a first edge of an expansion card and wherein the first groove extends in a direction substantially parallel to a motherboard of the information handling system. The apparatus also includes a first base member extending from the first elongated body, wherein the first base member is attachable to the motherboard and a first pivot portion extending from the first elongated body, wherein the first pivot portion is angled upward toward an interior side of the first bracket.

19 Claims, 6 Drawing Sheets

EXPANSION CARD RETENTION APPARATUS, SYSTEMS AND METHODS

BACKGROUND

1. Technical Field

The present disclosure relates generally to the field of information handling systems, and more specifically, to apparatus, systems and methods for retaining expansion cards within the chassis of information handling systems.

2. Background Information

As the value and use of information continues to increase, individuals and businesses seek additional ways to process and store information. One option available to users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for such systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems (IHSs) often provide expansion capabilities in the form of peripheral or expansion cards, such as PCI (Peripheral Component Interconnect), PCIE (PCI Express) or the like. Printed circuit boards or motherboards of IHSs may be designed with bus interfaces, such as ISA (Industry Standard Architecture) and EISA (Extended Industry Standard Architecture), into which expansion cards for peripheral expansion devices, such as hard disk controllers, tape controllers, modems and other I/O controllers, may be connected. A user or service technician may add or replace a peripheral expansion device, such as a modem, by simply adding a new modem card or replacing the old modem card attached to the bus interface with a new modem card.

As the trend in the manufacture of IHSs moves toward chassis of various sizes and orientations, apparatus and systems utilized to retain expansion cards within the IHS chassis may require modification. Currently, low profile IHSs, including industry or IU servers, are designed with limited chassis dimensions to fit within a confined space of a rack or rack system, such that another device may be placed above and/or below the IU server in the rack. Thus, the space or volume (e.g., swept volume) within the chassis to allow for the installation or removal of an expansion card may be limited as compared to that of a typical IHS chassis. Despite the manufacture of smaller or thinner form factor systems, customers may still desire options that allow for standard size cards, PCI and/or PCI and PCIE for example, to be utilized with such systems. Furthermore, maintaining attachment of an expansion card to its corresponding connector within a chassis during a shock event while still allowing ease in installing and removing the cards may present a challenge.

Typical apparatus and systems for retaining expansion cards allow for mounting an expansion card in a vertical orientation relative to a motherboard. In addition, due to size or height constraints of IHS chassis, current apparatus or systems to retain expansion cards may employ additional components such as risers, for example, to secure the cards to their connectors. However, the use of additional components and apparatus/systems for vertically mounting expansion cards may prove costly and prohibitive to achieving a more compact form for IHSs. Thus, a need exists for improved apparatus, systems and methods for securely retaining expansion cards within chassis of limited size.

SUMMARY

The following presents a general summary of several aspects of the disclosure in order to provide a basic understanding of at least some aspects of the disclosure. This summary is not an extensive overview of the disclosure. It is not intended to identify key or critical elements of the disclosure or to delineate the scope of the claims. The following summary merely presents some concepts of the disclosure in a general form as a prelude to the more detailed description that follows.

One aspect of the disclosure is an apparatus for retaining an expansion card within an information handling system. The apparatus provides a first bracket including a first elongated body defining a first groove for receiving a first edge of an expansion card and wherein the first groove extends in a direction substantially parallel to a motherboard of the information handling system. The apparatus also includes a first base member extending from the first elongated body, wherein the first base member is attachable to the motherboard and a first pivot portion extending from the first elongated body, wherein the first pivot portion is angled upward toward an interior side of the first bracket.

Another aspect of the disclosure is an apparatus for retaining an expansion card within an information handling system. The apparatus provides a first bracket and a second bracket for receiving an expansion card in a direction substantially parallel to a motherboard of the information handling system. Each of the first bracket and the second bracket may include an elongated body with a groove for receiving the expansion card. A pivot portion may extend from the elongated body of each of the brackets to guide insertion of the expansion card into the first bracket and provide clearance for insertion of the expansion card into the second bracket.

Yet another aspect of the disclosure is a method for mounting an expansion card in an information handling system. The method includes engaging a first edge of an expansion card with a first groove disposed within a first bracket attachable to a motherboard, wherein the first bracket includes a first elongated body with a first pivot portion extending from the first elongated body, the first pivot portion angled to guide direction of insertion of the first edge of the expansion card into the first bracket. The method further includes rotating the expansion card to engage a second edge of the expansion card with a second groove within a second bracket attachable to the motherboard. The second bracket may include a second elongated body with a second pivot portion extending from the second elongated body, the second pivot portion angled to provide clearance for insertion of the second edge of the expansion card into the second bracket, and whereby the expansion card is capable of being installed within the first bracket and the second bracket in a position substantially parallel to the motherboard of the information handling system.

BRIEF DESCRIPTION OF THE DRAWINGS

For simplicity and clarity of illustration, the drawing and/or figures illustrate the general manner of construction of an information handling system and components thereof. Descriptions and details of well known features and techniques may be omitted to avoid unnecessarily obscuring the disclosure.

For detailed understanding of the present disclosure, references should be made to the following detailed description of the several aspects, taken in conjunction with the accompanying drawings, in which like elements have been given like numerals and wherein.

DETAILED DESCRIPTION

Before the present apparatus, systems and methods are described, it is to be understood that this disclosure is not limited to the particular apparatus, systems and methods described, as such may vary. One of ordinary skill in the art should understand that the terminology used herein is for the purpose of describing possible aspects, embodiments and/or implementations only, and is not intended to limit the scope of the present disclosure which will be limited only by the appended claims.

It must also be noted that as used herein and in the appended claims, the singular forms "a," "and," and "the" may include plural referents unless the context clearly dictates otherwise. Thus, for example, reference to "a bracket" refers to one or several brackets, and reference to "a method of retaining" includes reference to equivalent steps and methods known to those skilled in the art, and so forth.

For purposes of this disclosure, an embodiment of an Information Handling System (IHS) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an IHS may be a personal computer, a storage device, or any other suitable device and may vary in size, shape, performance, functionality, and price. The IHS may include random access memory (RAM), one or more processing resources such as a central processing unit (CPU) or hardware or software control logic, ROM, and/or other types of nonvolatile memory. Additional components of the IHS may include one or more disk drives, one or more network ports for communicating with external devices as well as various input and output (I/O) devices, such as a keyboard, a mouse, and a video display. The IHS may also include one or more buses operable to transmit data communications between the various hardware components.

Figure 1:
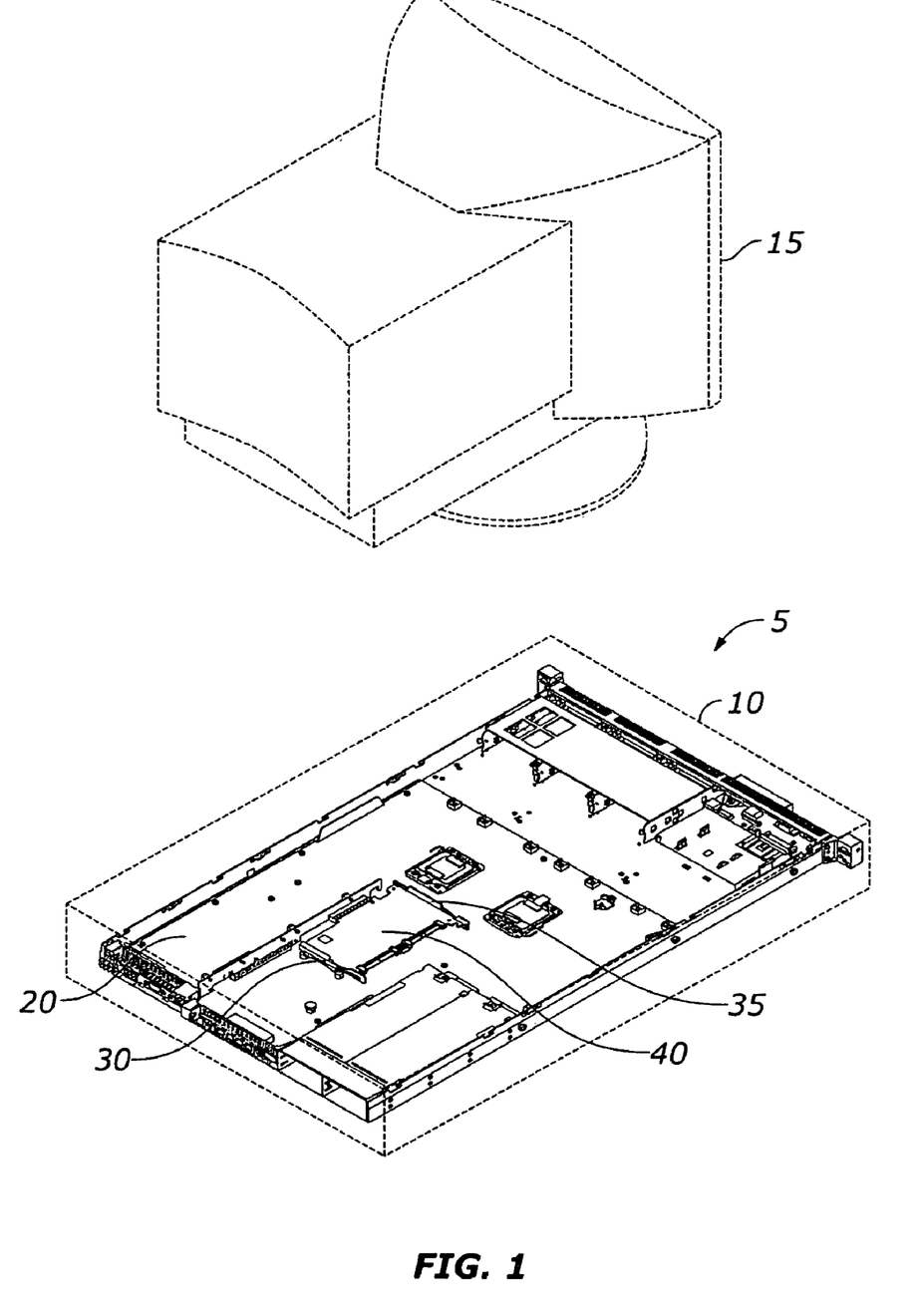
FIG. 1 is an illustrative schematic of an information handling system (IHS) in accordance with one aspect of the present disclosure.

FIG. 1 represents an illustrative schematic of one possible implementation of an information handling system (IHS) indicated generally at 5. It should be understood that the present disclosure has applicability to IHSs as broadly described and/or shown herein, and is not intended to be limited to the IHS 5 as specifically described or shown. An IHS may be in the form of a blade server, a tower computer, a desktop computer, a laptop computer, or the like. The IHS 5 includes a chassis 10, provided to house some or all of the components of the IHS 5, in which a printed circuit board or motherboard 20 is mounted. An IHS 5 also includes a controller or CPU (not shown) which may comprise a processor, a microprocessor, minicomputer, or any other suitable device, including combinations and/or a plurality thereof, for executing programmed instructions. The CPU may be in data communication over a local interface bus (not shown) with components including various input/output interfaces (not shown) and memory which may contain programming and/or executable instructions required to control a keyboard (not shown), a mouse (not shown), a display 15 and/or other suitable input/output devices. The IHS 5 may further comprise an apparatus for retaining an expansion card such as the card 40 onto the motherboard 20 utilizing at least one bracket 30, 35 to be described in more detail below. It is understood that other components, electrical traces, electrical circuits and related devices may be provided in the chassis 10.

Figure 2:
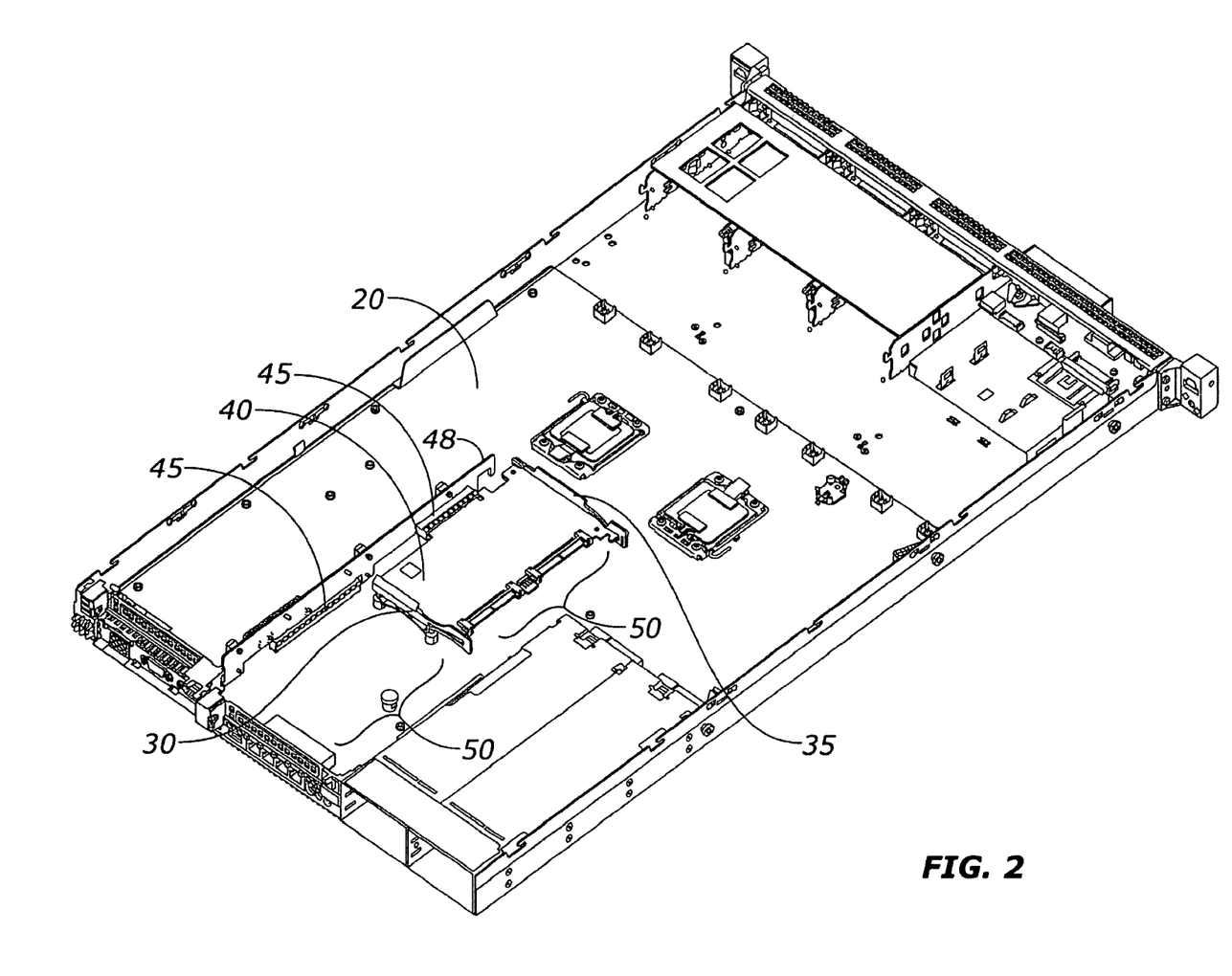
FIG. 2 is a perspective view of components within a chassis of the IHS in FIG. 1.

Referring now to FIG. 2, a perspective view is provided of components within a chassis of one possible implementation of an IHS. Shown is an example of an interior of the chassis which is designed to receive a printed circuit board or expansion card 40 (e.g., modem card, fax card and other input/output (I/O) device card) within an expansion slot 50. An expansion card 40 may have electrical components mounted thereon and interconnected by printed circuit wiring, in any conventional manner. Any suitable expansion card type may be utilized within the present disclosure including, for example, Peripheral Component Interconnect (PCI), Peripheral Component Interconnect Express (PCIE), Advanced Graphics port (AGP), Industry Standard Architecture (ISA) and Extended Industry Standard Architecture (EISA). A connector 45 may be mounted on the motherboard 20 and coupled to a riser 48 to receive an expansion card 40. Further, the connector 45 may be configured to receive cables and/or wiring (e.g., bus) for electrically coupling peripheral expansion devices to the IHS 5 within an expansion slot 50 via the expansion card 40. It is understood that the connector 45 may contain a number of electrically conductive pins (not shown) which may fit with a connector edge (described below) of the expansion card 40 to secure an electrical connection between the connector 45 and the expansion card 40.

The riser 48, as shown, is coupled to the motherboard at a substantially perpendicular (i.e., 90 degree angle). Generally, the riser 48 may serve to allow the expansion card 40 to communicate with the motherboard. In addition, the riser 48, coupled to the connector 45, may allow the connection of two expansion cards 40 adjacent to one another. Further, the bottom portion of the riser 48 may include additional connectors (e.g., goldfingers) which contact and/or plug into the motherboard 20.

Brackets 30, 35 are shown mounted to an inner surface of the motherboard 20. It is understood that the brackets 30, 35 may be mounted to the motherboard 20 by any tool-based or tool-free mechanism, such as a latch, a fastener or other suitable technique. The brackets 30, 35 are adapted to receive and latch portions of an expansion card, such as card 40, of various types, sizes, and configurations, in its mounted position in the chassis 10. Further, the brackets 30, 35 may function to provide support to the expansion card 40 and secure it in its operative position in the chassis 10. The expansion card 40 is shown in an elevated position relative to the chassis 10, and the card 40 is shown mounted into or engaged with a connector 45 within the chassis 10. In one possible implementation, an expansion card 40 may be engaged with a connector 45 whereby the card 40 may be in a substantially horizontal orientation relative to the motherboard 20.

Figure 3:
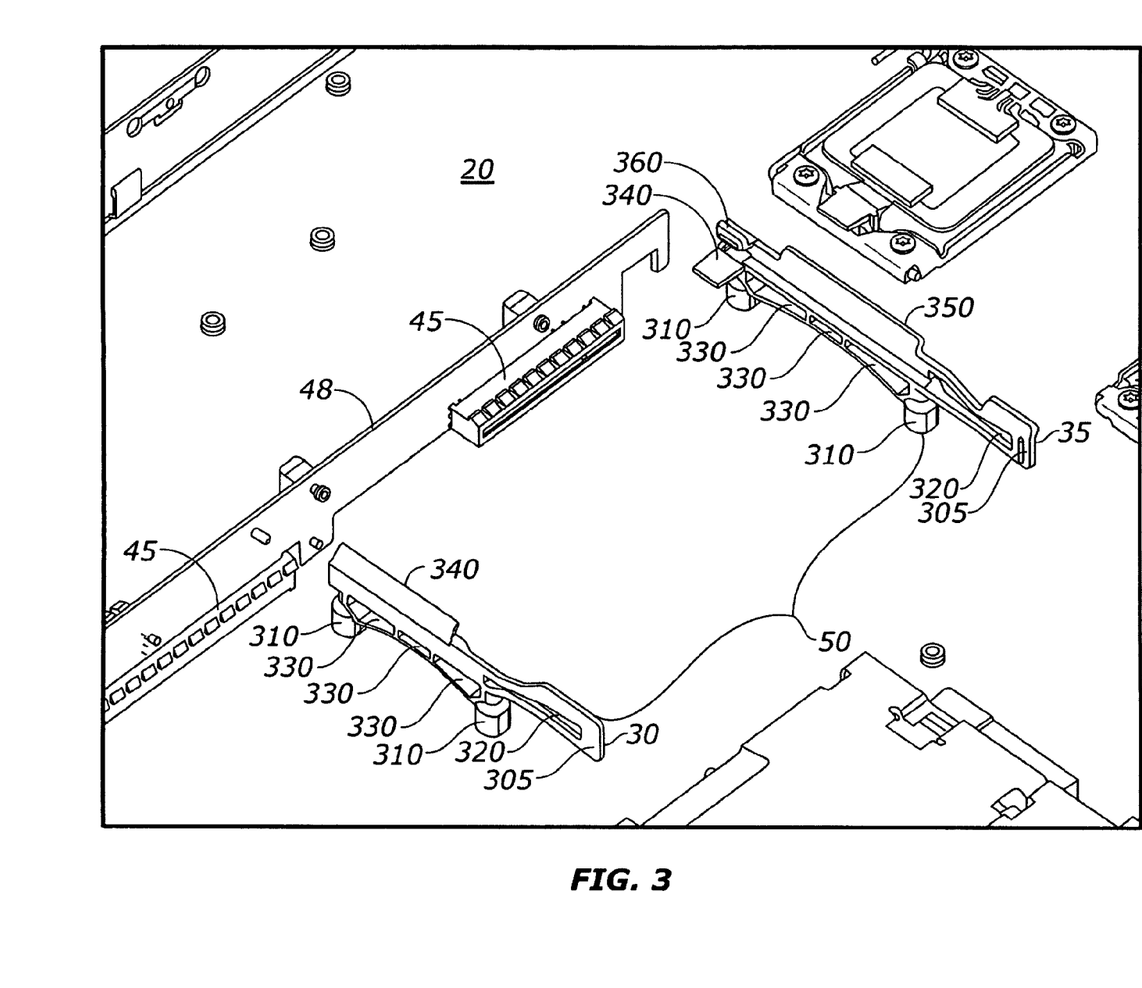
FIG. 3 is a perspective view of one implementation of an apparatus for retaining an expansion card in an information handling system.

FIG. 3 represents a perspective view of an apparatus for retaining an expansion card in accordance with one aspect of the present disclosure. The retention apparatus includes brackets 30, 35 shown in a disengaged position and coupled to a motherboard 20, i.e., without coupling to an expansion card. It should be understood that FIG. 3 represents merely one depiction of the brackets 30, 35 in a disengaged position. Generally, the brackets 30, 35 assume a disengaged position when an expansion card is not fixedly secured to the brackets 30, 35 nor installed into the connector 45 or riser 48.

As shown, the brackets 30, 35 are formed from one piece of material such as plastic, metal, any suitable material or any combination thereof, having an elongated body (to be described below) and at least one base member 310. On one end of each bracket 30, 35 may be a flexible arm 305 which can pivot with respect to the body, thereby engaging or disengaging an expansion card. Each bracket 30, 35 includes a groove 320 which may extend substantially the lengths of the brackets 30, 35 and are adapted to receive one edge of an expansion card. The flexible arms 305 and/or groove 320 may provide a retention force against the card 40 to retain the card securely within its respective expansion slot 50. To provide support and a mounting surface to secure the expansion card 40 on bracket 35, a support member 340 may be formed on a portion of the body substantially parallel to the groove 320 on one end of the bracket 35 proximate to the connector 45. In addition, a tab 360 may further be formed on a portion of the body substantially parallel to the groove 320 but above the support member 340. The tab 360 may serve to secure the expansion card within the groove 320, particularly when the brackets 30, 35 are in an engaged position. Each elongated body of the brackets 30, 35 may also define a series of recess portions 330 provided to enhance flexibility and reduce the overall weight of the bracket 30. Further, each bracket 30, 35 may form pivot portions 340, 350 extending at angles relative to the elongated bodies of bracket 30, 35 (to be described in more detail below).

Figure 4:
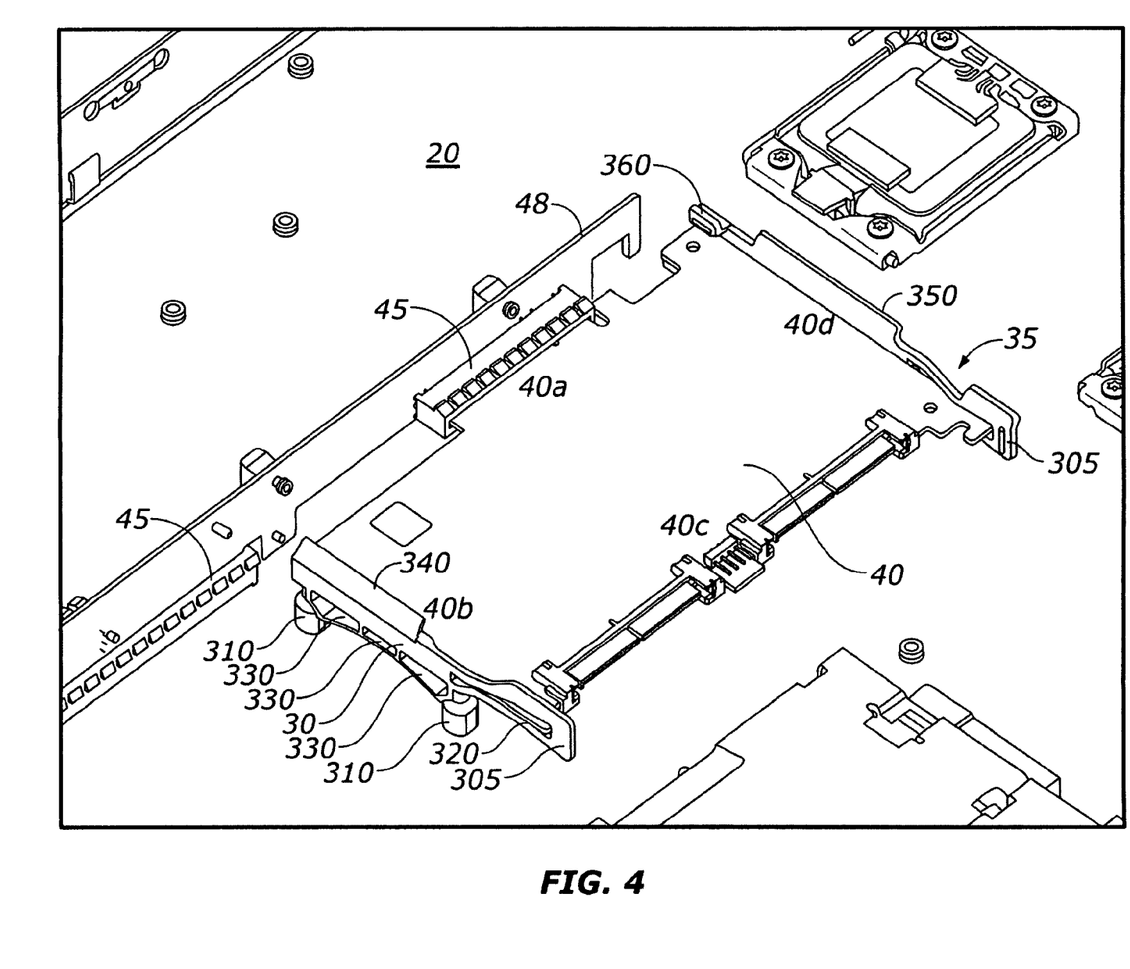
FIG. 4 is a perspective view of the apparatus in FIG. 3 engaged with an expansion card.

Referring now to FIG. 4, a perspective view is provided of a retention apparatus described above engaged with an expansion card 40. The retention apparatus includes brackets 30, 35 shown in an engaged position whereby an expansion card 40 is fixedly secured to the brackets 30, 35 along grooves 320 and the connector 45. When the brackets 30, 35 are in an engaged position, an expansion card 40 is coupled to the brackets 30, 35 to fixedly secure an electrical connection between the connector 45 and/or riser 48 and the expansion card 40. The brackets 30, 35 may define various recess portions 330 and base members 310 to secure the brackets 30, 35 to the motherboard 20. The flexible arms 305 of the brackets 30, 35 and the connector 45 engage the expansion card 40 substantially parallel or horizontal to the motherboard 20.

As shown, the expansion card 40 may comprise several edges 40a, 40b, 40c and 40d which contact the connector 45 and the brackets 30, 35 at various points. The connector edge 40a and free edge 40c are directly opposite one another and run the length of the expansion card 40. Bracket edges 40b, 40d are directly opposite one another and run the width of the expansion card 40. When the brackets 30, 35 and/or expansion card 40 are in an engaged position, the card 40 is fixedly secured so that the connector edge 40a is coupled to the connector 45 and bracket edges 40b, 40d are coupled to the brackets 30, 35. As depicted in FIG. 4, an implementation of an apparatus for retaining an expansion card may include a first bracket 30 and a second bracket 35 to receive two bracket edges 40b, 40d, respectively.

To install or mount the expansion card 40, a first bracket edge 40b may be engaged with the groove 320 of the first bracket 30 and while rotating the card 40, a second bracket edge 40d is engaged with the groove 320 of the second bracket 35 until a connector edge 40a extends into the connector 45. The expansion card 40 may be inserted into the brackets 30, 35 in a horizontal position or at an angle up to 90 degrees relative the motherboard 20. The pivot portion 340 extending from the body of the first bracket 30 is angled to guide insertion of the bracket edge 40b of the expansion card 40 into or along the groove 320 of the first bracket 30 prior to engaging the card 40 with the second bracket 35. Thus, the groove 320 of the first bracket 30 does not secure the expansion card until it is fully seated within both brackets 30, 35. Furthermore, the pivot portion 350 extending from the body of the second bracket 35 is angled to provide clearance for the expansion card 40 to rotate into the groove 320 of the second bracket 35. As such, an expansion card 40 may be installed into the brackets 30, 35 without the use of tools and/or using one hand.

Each of the flexible arms 305 may provide a retention force against the expansion card 40 in an engaged position. The card 40 may be installed at a slightly elevated and substantially parallel (i.e., horizontal) position relative to the motherboard 20. Further, the card 40 is thus engaged whereby the connector edge 40a is secured in the connector 45 and both bracket edges 40b, 40d are secured by brackets 30, 35. Once engaged, the expansion card 40 rests on the brackets 30, 35 and the card 40 is retained in both a horizontal and vertical orientation in the plane of the expansion card 40 at its corners. By utilizing the retention apparatus disclosed herein, the sweep length required for insertion of the card 40 may be reduced, thus enabling the efficient installation and removal of the expansion card 40 within chassis of limited size and height.

Alternatively, to disengage, remove or eject the expansion card 40, one or both flexible arms 305 may release the retention force applied to the card 40. While still seated in the groove 320 of the first bracket 30, the second bracket edge 40d may be released or disengaged from the groove 320 of the second bracket 35. Once the second bracket edge 40d is disengaged, the first bracket edge 40b may then be disengaged from the groove 320 of the first bracket 30.

Figure 5:
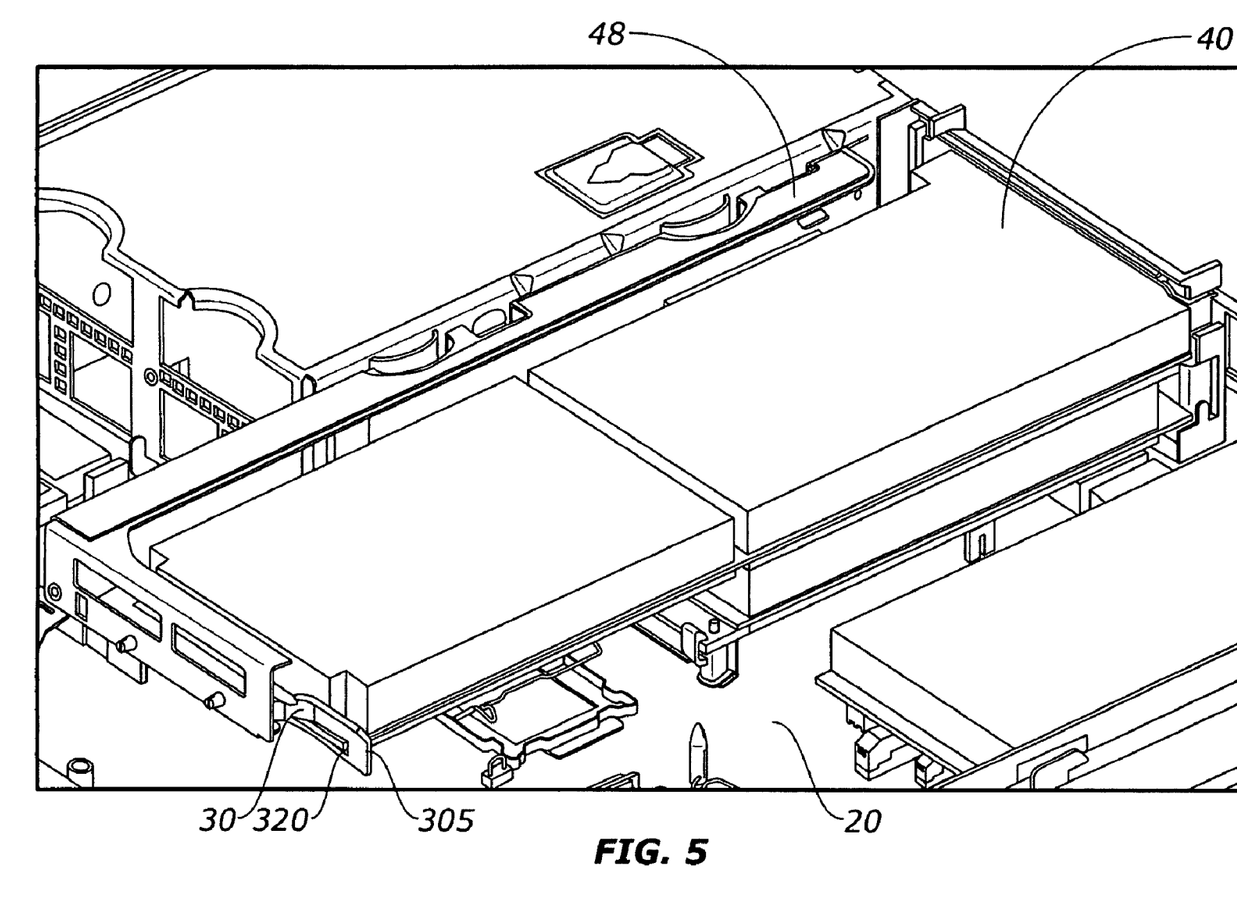
FIG. 5 is a perspective view of a second implementation of an apparatus for retaining an expansion card in an information handling system.

Turning to FIG. 5, a perspective view is provided of an alternative implementation of an apparatus for retaining an expansion card in an information handling system. Shown coupled to a motherboard 20 is a single bracket 30 defining a groove 320 for receiving one edge of an expansion card 40. An alternative edge of the expansion card 40 may be secured by a riser 48 or other suitable structure coupled to the motherboard 20 for engaging with an expansion card 40.

To install an expansion card 40, one edge of the card 40 is first seated in the **riser 48 or the like. An opposing edge of the expansion card 40 is then engaged with the groove 320 of the bracket 30. The flexible arm 305 extending from the bracket 320 may then be flexed toward the expansion card to secure the card 40 in a position substantially parallel to the motherboard 20. Conversely, the flexible arm 305 may be flexed away from the expansion card 40 to disengage and/or remove the card 40.

Figure 6:
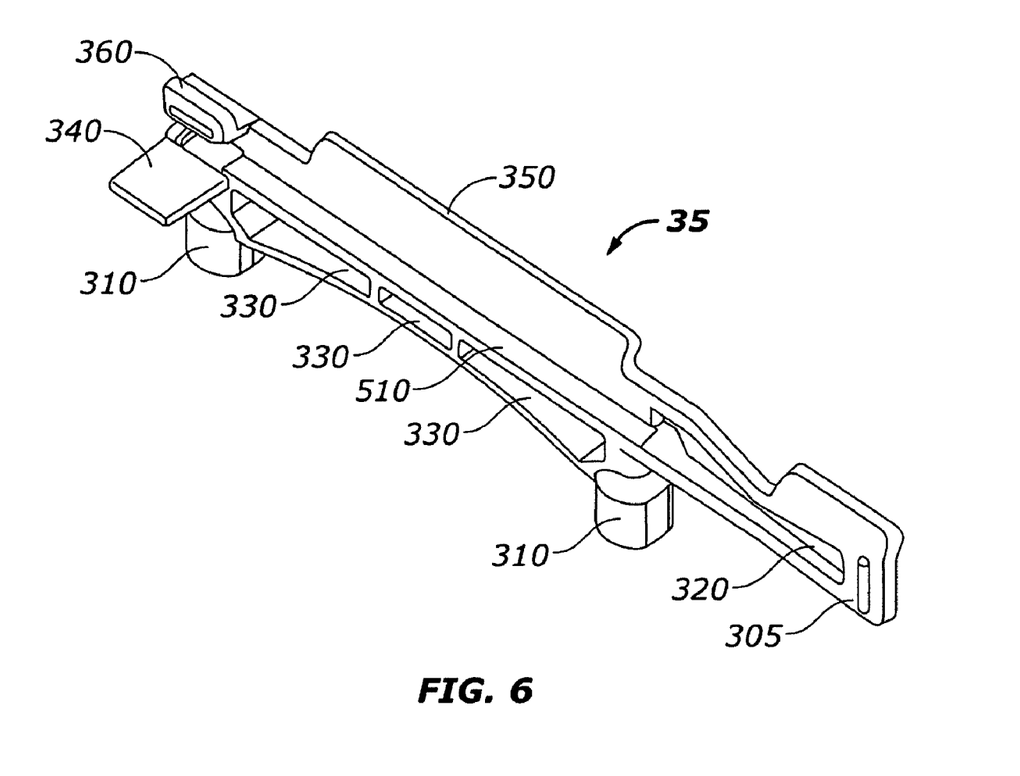
FIG. 6. is a perspective view of one implementation of a bracket component of an apparatus for retaining an expansion card in an information handling system.
Figure 7:
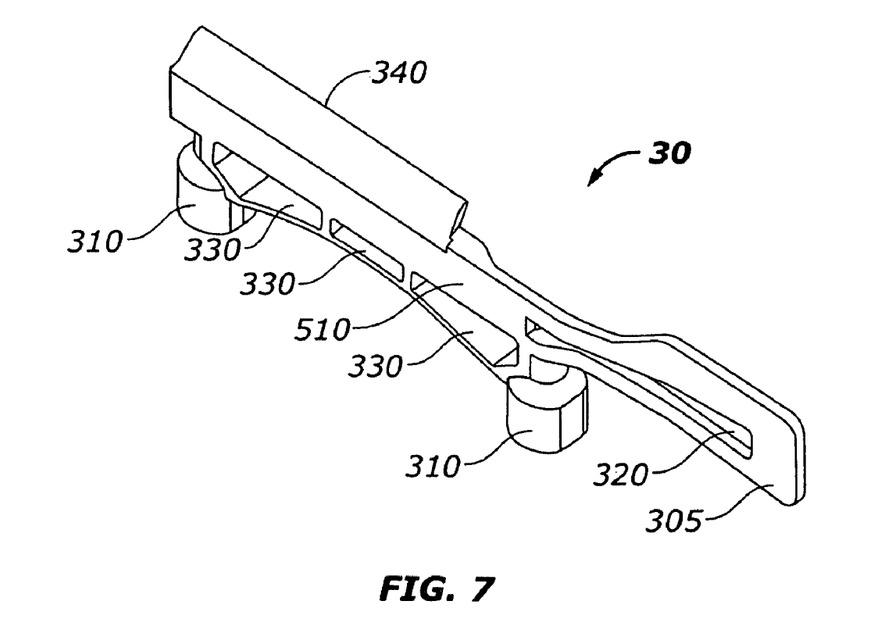
FIG. 7 is a perspective view of a second implementation of a bracket component of an apparatus for retaining an expansion card in an information handling system.

FIGS. 6 and 7 provide perspective views of bracket components of an apparatus for retaining an expansion card in an information handling system. Brackets 30, 35 each form an elongated body 510 with a flexible arm 305 at one end and are mountable to a motherboard (not shown) via base members 310. Further disposed upon the elongated body 510 are a plurality of recess portions 330 and a groove 320 for receiving an expansion card. As shown, the groove 320 may extend substantially the length of the first elongated body 510 or any suitable length to receive the expansion card. Bracket 30, also referred to herein as the first bracket, may include a first pivot portion 340, as shown in FIG. 7 angled slightly upward toward an interior side of the first bracket 30 which may be in contact with the expansion card 40. As shown in FIG. 6, a second pivot portion 350 may be angled slightly upward away from an interior side of the second bracket 35 which may be in contact with the expansion card 40

The brackets 30, 35 may receive an expansion card 40 in a direction substantially parallel to a motherboard 20, generally not requiring substantial vertical space within the chassis for expansion card installation/removal. Thus, the brackets 30, 35 may provide an efficient and inexpensive means to secure an expansion card 40 without occupying an excessive or inordinate amount of space within the chassis of an IHS.

Particular embodiments and/or implementations of the present disclosure have been described in detail. However, the present disclosure is not limited to these embodiments and/or implementations, and it is understood by one skilled in the art that various other embodiments and/or implementations are possible within the scope of the present disclosure. For example, it should also be understood that although two brackets 30 are shown engaged with one expansion card 40 attached to one connector 45 in FIGS. 1-4 and described as such for purposes of illustration only, a chassis may include additional brackets 30 and connectors 45 for accommodating additional expansion cards 40. Also, while the base member 310 is shown in FIGS. 1-4 to be substantially circular in shape, the base member 310 may take the form of any suitable shape such as square, rectangular or the like. Although not easily ascertained from the drawings, it is understood that the bracket 30 may be attached or coupled to the motherboard 20 by any suitable attachment means such as by bolts, fasteners or the like, which extend through openings in the motherboard 20.

Thus, modifications and variations may be made without departing from the spirit and scope of the claimed subject matter in the present disclosure. Such changes in form and detail, including use of equivalent functional and/or structural substitutes for elements described herein, fall within the scope of the appended claims and are intended to be covered by this disclosure.

What is claimed is:

1. An apparatus for retaining an expansion card within an information handling system, the apparatus comprising: a first bracket comprising: a first elongated body defining a first groove for receiving a first edge of an expansion card, the first groove extending in a direction substantially parallel to a motherboard of the information handling system; a first base member extending from the first elongated body, wherein the first base member is attachable to the motherboard; a first pivot portion extending from the first elongated body, wherein the first pivot portion, unparallel to the motherboard, is angled upwardly and inwardly toward an interior side of the first bracket, the interior side of the first bracket to be in contact with the expansion card; and a second bracket comprising: a second elongated body defining a second groove for receiving a second edge of the expansion card, the second groove extending in a direction substantially parallel to the motherboard; a second base member extending from the second elongated body, wherein the second base member is attachable to the motherboard; a second pivot portion extending from the second elongated body, wherein the second pivot portion, unparallel to the motherboard, is angled upwardly and outwardly away from an interior side of the second bracket, the interior side of the second bracket to be in contact with the expansion card.

2. The apparatus of claim 1, wherein the first pivot portion is angled to guide direction of insertion of the expansion card into the first groove.

3. The apparatus of claim 1, wherein the first bracket further comprises a flexible arm movable between an engaged position and a disengaged position, wherein the flexible arm is operable to permit removal of the expansion card in the disengaged position and installation of the expansion card in the engaged position.

4. The apparatus of claim 1, wherein the first groove extends substantially the length of the first elongated body.

5. The apparatus of claim 1 further comprising a flexible arm movable between an engaged position and a disengaged position, wherein the flexible arm is operable to permit removal of the expansion card in the disengaged position and installation of the expansion card in the engaged position.

6. The apparatus of claim 1, wherein the second groove extends substantially the length of the second elongated body.

7. The apparatus of claim 1, wherein a tab is formed on a portion of the second elongated body substantially parallel to the groove and wherein the tab is operable to secure the expansion card.

8. The apparatus of claim 1, wherein the second pivot portion is angled to provide clearance guide direction of insertion of the expansion card into the first groove wherein the second pivot portion provides clearance for insertion of the expansion card.

9. An apparatus for retaining an expansion card within an information handling system, the apparatus comprising:
a first bracket and a second bracket for receiving an expansion card in a direction substantially parallel to a motherboard of the information handling system, wherein each of the first bracket and the second bracket comprise an elongated body with a groove for receiving the expansion card, a pivot portion extending from the elongated body to guide insertion of the expansion card into the first bracket and provide clearance for insertion of the expansion card into the second bracket, wherein a first pivot portion of the first bracket, extending unparallel to the motherboard, is angled upwardly and inwardly toward an interior side of the first bracket, the interior side of the first bracket to be in contact with the expansion card, and a second pivot portion of the second bracket, extending unparallel to the motherboard, is angled upwardly and outwardly away from an interior side of the second bracket, the interior side of the second bracket to be in contact with the expansion card.

10. The apparatus of claim 9 wherein each of the first bracket and the second bracket further comprise a flexible arm movable between an engaged position and a disengaged position, the flexible arm operable to permit removal of the expansion card in the disengaged position and installation of the expansion card in the engaged position.

11. The apparatus of claim 9, wherein the groove extends substantially the length of the first elongated body.

12. The apparatus of claim 9, wherein a tab is formed on a portion of the second body substantially parallel to the groove and wherein the tab is operable to secure the expansion card.

13. The apparatus of claim 9, wherein the first bracket and the second bracket are not mirror-images of one another.

14. A method for mounting an expansion card in an information handling system, the method comprising:
engaging a first edge of an expansion card with a first groove disposed within a first bracket attachable to a motherboard, wherein the first bracket includes a first elongated body with a first pivot portion, unparallel to the motherboard, extending from the first elongated body, the first pivot portion angled upwardly and inwardly toward an interior side of the first bracket to guide direction of insertion of the first edge of the expansion card into the first bracket, the interior side of the first bracket to be in contact with the expansion card; and
rotating the expansion card to engage a second edge of the expansion card with a second groove within a second bracket attachable to the motherboard, wherein the second bracket includes a second elongated body with a second pivot portion, unparallel to the motherboard, extending from the second elongated body, the second pivot portion angled upwardly and outwardly away from an interior side of the second bracket to provide clearance for insertion of the second edge of the expansion card into the second bracket, the interior side of the second bracket to be in contact with the expansion card, and whereby the expansion card is capable of being installed within the first bracket and the second bracket in a position substantially parallel to the motherboard of the information handling system.

15. The method of claim 14 further comprising:
moving a flexible arm of each of the first bracket and the second bracket between an engaged position and a disengaged position, the flexible arm operable to permit removal of the expansion card in the disengaged position and installation of the expansion card in the engaged position.

16. The method of claim 14, wherein the expansion card is capable of being installed by moving the flexible arm toward the expansion card in a horizontal direction relative to the motherboard.

17. The method of claim 14, a tab is formed on a portion of the second elongated body substantially parallel to the second groove and wherein the tab is operable to secure the expansion card.

18. The method of claim 14, wherein each of the first groove and the second groove extends substantially the length of the first elongated body and the second elongated body.

19. The method of claim 14, wherein the first bracket and the second bracket are not mirror-images of one another.

* * * * *